United States Patent [19]

Hashimoto et al.

[11] Patent Number: 4,619,704

[45] Date of Patent: Oct. 28, 1986

[54] COMPOSITION FOR FORMING A TRANSPARENT CONDUCTIVE FILM

[75] Inventors: Tadanori Hashimoto; Hiroshi Yoshitake; Shigenao Hata; Akiko Nakazono, all of Osaka, Japan

[73] Assignee: Sumitomo Chemical Company, Limited, Osaka, Japan

[21] Appl. No.: 680,729

[22] Filed: Dec. 12, 1984

[30] Foreign Application Priority Data

Dec. 22, 1983 [JP] Japan ................................ 58-242534

[51] Int. Cl.$^4$ ................................................ C09D 1/00
[52] U.S. Cl. ............................ 106/286.4; 106/287.17; 106/287.18
[58] Field of Search ....................... 106/287.17, 287.18, 106/286.4; 428/446

[56] References Cited

U.S. PATENT DOCUMENTS

| 3,372,038 | 3/1968 | Weldes et al. | 106/287.18 X |
| 4,034,129 | 7/1977 | Kittle | 106/287.18 X |
| 4,401,474 | 8/1983 | Donley | 106/287.18 X |
| 4,456,549 | 6/1984 | Kano et al. | 106/287.18 X |

FOREIGN PATENT DOCUMENTS 2039865 8/1980 United Kingdom ........... 106/287.18

*Primary Examiner*—Nancy A. B. Swisher
*Attorney, Agent, or Firm*—Sughrue, Mion, Zinn, Macpeak, and Seas

[57] ABSTRACT

A composition for forming a transparent conductive film obtained by mixing an organic solution comprising an indium salt of inorganic acid and a tin salt of an inorganic acid with a non-aqueous silica sol. The composition of the present invention shows excellent stability with a lapse of time and good wettability to a substrate plate. A transparent conductive film obtained shows a strong adhesion strength to a substrate plate and has a two-layered structure.

3 Claims, No Drawings

COMPOSITION FOR FORMING A TRANSPARENT CONDUCTIVE FILM

FIELD OF THE INVENTION

The present invention relates to a composition which is capable of forming a transparent conductive metal oxide film on a substrate plate and a method for forming a transparent conductive film.

BACKGROUND OF THE INVENTION

Electrode materials which are transparent to light have been widely used for electrodes in display devices, such as liquid crystal display devices, electroluminescense, etc., and photosensitive devices, such as photocells, image pick-up tubes, etc., as well as anti-clouding or anti-freezing electrodes for window glass of automobiles, aeroplanes, buildings and the like.

As such transparent electrode materials, a tin oxide-antimony oxide type, an indium oxide-tin oxide type and the like are well known. These metal oxides can form a film on a glass or ceramic plate to provide a transparent conductive film.

The well-known methods for forming a transparent conductive film includes (1) a vacuum evaporation method, (2) a sputtering method, (3) a CVD method, and (4) a coating method.

However, each of the above-described methods (1), (2) and (3) has problems in that: equipments used therefor are so complicated that these methods are inferior in processability; and in usual cases, etching should be carried out after film formation in order to form patterns.

The above-described method (4) offers a possibility of solving the aforesaid problems associated with the methods (1) to (3), but there still is a problem that it is difficult to obtain a transparent conductive thin film which can withstand practical use.

For example, a method of using an organic solution of an inorganic salt, e.g., $InCl_3$, $In(NO_3)_3$, $SnCl_4$, etc., involves disadvantages such as causing milky turbidity of the resulting conductive film or insufficient mechanical strength to easily get scratches.

A method of using an indium salt of an organic acid having a strong ionic bond, such as indium octylate, involves a disadvantage such as causing gelation of the coating composition because of tendency to readily hydrolyze and easily occur chemical change.

A method of using an organic complex of indium or tin involves a disadvantage such as hindrance in homogenization of the baked film upon thermal decomposition of the coated film formed on the substrate plate, thus causing non-uniformity or insufficient sheet resistivity.

Moreover, in any of the above described cases, when a transparent conductive film is formed on a soda glass substrate plate, silica coating must be performed on the soda glass substrate plate to prevent elution of sodium ion from the soda glass plate.

SUMMARY OF THE INVENTION

An object of the present invention is to provide a novel composition which is capable of forming a transparent conductive film.

Another object of the present invention is to provide a composition which need not silica coating procedure so far necessary to prevent elution of sodium ion from the soda glass.

A further object of the present invention is to provide a method for producing a transparent conductive film having a two-layered structure and a strong adhesion strength to a substrate plate.

That is, the present invention relates to a composition and a method which can attain the above-described objects.

DETAILED DESCRIPTION OF THE INVENTION

The composition of the present invention can be obtained by mixing an organic solution of an indium salt of an inorganic acid and a tin salt of an inorganic acid with a non-aqueous silica sol.

The method for forming a transparent conductive film of the present invention comprises:

(1) coating the composition on a substrate plate,
(2) drying the thus coated substrate plate, and then
(3) heat baking the dried substrate plate.

An important characteristic of the present invention resides in that the composition contains a non-aqueous silica sol. The non-aqueous silica sol contains hyperfine particles each having on the surface thereof a silanol group capable of imparting a thixotropy effect. The non-aqueous silica sol provides an improved wettability to the composition, whereby the transparent conductive film obtained can show excellent transmittance, conductivity and adhesion property.

The coated film formed by coating the composition, drying and then heat baking according to the method of the present invention has a completely two-layered structure. That is, the upper layer consists of indium tin oxide and the lower layer consists of silica. This structure was identified by the following surface analyses.

The presence of the upper layer (referred to as "ITO layer" hereinafter) was confirmed by ESCA analysis and X-ray diffraction analysis of the surface of the coated film as well as chemical analysis of a solution obtained by hydrochloric acid-etching of the surface. Further, the presence of the lower layer (referred to as "$SiO_2$ layer" hereinafter) was confirmed by ESCA analysis and X-ray diffraction analysis of the etched surface as well as chemical analysis of a solution obtained by hydrofluoric acid-etching of the etched surface.

Therefore, according to the method of the present invention, it is possible to omit a silica coating procedure so far necessary to thereby minimize the total cost.

The composition of the present invention will be described below in more detail.

The indium salt of an inorganic acid that can be used in the present invention is generally an indium salt of a mineral acid such as indium chloride or indium nitrate. The content of the indium salt is generally about 0.5% to about 30% by weight, preferably about 1% to about 20% by weight (calculated as indium oxide), in order to obtain a transparent conductive film showing low resistivity.

The tin salt of an inorganic acid that can be used in the present invention is generally a tin salt of a mineral acid such as stannic chloride. The content of the tin salt is generally about 0.5% to about 30% by weight, preferably about 1% to about 20% by weight, in terms of the proportion of tin to indium, in order to lower resistivity of a transparent conductive film.

The indium salt and tin salt may be each a hydrate thereof.

The non-aqueous silica sol that can be used in the present invention is not particularly limited, but a silica sol obtained by hydrolyzing orthoethyl silicate in the presence of a catalyst and a silica sol obtained by reacting tetrachlorosilane with acetic anhydride, followed by hydrolyzing in the presence of a catalyst can be preferably used. More preferably, an organic solution of silicic acid prepared by liquid-phase neutralization of an aqueous solution of sodium silicate with a mineral acid such as sulfuric acid, followed by subjecting the neutralized solution to salting-out with a salting-out agent and extraction with an extractant, can be used. Examples of the extractant include organic solvents such as tetrahydrofuran, isopropyl alcohol and t-butanol. Examples of the salting-out agent include sodium chloride and ammonium chloride. The thus prepared non-aqueous silica sol is inexpensive and can be prepared easily.

The non-aqueous silica sol as prepared above is a transparent solution which shows excellent stability with a lapse of time and contains silica particles having a particle size of about 0.02 $\mu$m to about 0.1 $\mu$m. The concentration of the silica in the non-aqueous silica sol is not particularly limited, but it is usually in the range of from about 1% to about 20% by weight as $SiO_2$.

The content of the non-aqueous silica sol added in the composition is about 1% to about 200% by weight, preferably about 10% to about 100% by weight, in terms of the proportion of $SiO_2$ to indium oxide.

The organic solvent used is selected taking into account solubilities of the indium salt and the tin salt, compatibility with the non-aqueous silica sol, and solubility of a cellulose compound described below. The organic solvent is not particularly limited but includes acetone, tetrahydrofuran, methanol, ethanol, isopropyl alcohol, t-butanol, ethylene glycol, diethylene glycol, ethyl cellosolve, and ethyl carbitol. These organic solvents can be used singly or in combination.

As a thickener, cellulose compounds may be added to the composition of the present invention to thereby increase thixotropy and obtain a transparent conductive film having superior properties. Although the cellulose compound added to the composition of the present invention is not particularly limited, but it is selected taking into account solubility in the organic solvent, thickening property, dispersability, thermoplastic property, pyrolysis property and the like. Examples of the cellulose compound include ethyl cellulose, nitrocellulose, cellulose acetate, hydroxypropyl cellulose, and ethyl hydroxyethyl cellulose. Among them, nitrocellulose, cellulose acetate, hydroxypropyl cellulose, and ethyl hydroxyethyl cellulose can be preferably used because they prevent a hygroscopic phenomenon of the coating composition under high temperature and humidity atmosphere. Therefore, addition of the cellulose compound is effective for preventing the hindrance in homogenization of the coating composition and milky turbidity of the conductive film.

The content of the cellulose compound in the composition of the present invention is not particularly limited but generally ranges from about 0.1% to about 5% by weight for the dipping and spinning methods and from about 10% to about 50% by weight for the screen and offset printing methods, respectively.

The composition of the present invention thus prepared shows an excellent stability with a lapse of time, and even when allowed to stand for 3 months, it undergoes no gelation. Further, the film obtained by coating the composition on a substrate plate, drying, and then heat baking the substrate plate shows no lowering of the properties.

The method for forming a transparent conductive film of the present invention will be described below.

Coating of the composition of the present invention can be carried out by commonly employed coating techniques, such as dipping, spinning, screen printing, offset printing, etc.

The thus coated composition is generally subjected to a drying treatment at about 40° C. to about 250° C. and then to a heat baking treatment at about 400° C. to about 900° C., to thereby form a transparent conductive film. The heat baking should be performed in an oxygen-containing gas atmosphere in order to provide a sufficient amount of oxygen to the composition.

The present invention will now be illustrated in greater detail with reference to the following examples, but it should be understood that these examples are not limiting the present invention.

EXAMPLE 1

Prescribed amounts of indium chloride and stannic chloride were dissolved in tetrahydrofuran, and the solution was mixed with a non-aqueous silica sol having a concentration of 5% by weight (as $SiO_2$). The non-aqueous silica sol mixed was prepared by neutralizing an aqueous solution containing sodium silicate with sulfuric acid and subjecting the neutralized solution to salting-out with ammonium chloride and extraction with tetrahydrofuran. Then, a prescribed amount of a cellulose compound shown in Table 1 was added to the solution and stirred well. There were thus prepared compositions shown in Table 1.

TABLE 1

| | Composition | | | | | | Cellulose Compound | |
|---|---|---|---|---|---|---|---|---|
| Composition No. | $InCl_3$ (wt %) | Converted to basis of $In_2O_3$ (wt %) | $SnCl_4$ (wt %) | Converted to basis of Sn/In (wt %) | $SiO_2$ (wt %) | Converted to basis of $SiO_2/In_2O_3$ (wt %) | Name | Amount (wt %) |
| A | 6.4 | 4.0 | 0.7 | 9.6 | 1.6 | 40 | hydroxypropyl cellulose | 1.0 |
| B | 6.4 | 4.0 | 0.7 | 9.6 | 1.6 | 40 | nitrocellulose | 1.0 |
| C | 3.2 | 2.0 | 0.4 | 11.0 | 0.8 | 40 | cellulose acetate | 4.0 |
| D | 8.0 | 5.0 | 0.9 | 9.9 | 2.0 | 40 | ethyl hydroxyethyl cellulose | 1.0 |
| E | 6.4 | 4.0 | 0.7 | 9.6 | 1.6 | 40 | ethyl cellulose | 1.0 |
| F | 10.0 | 6.3 | 1.1 | 9.7 | 2.5 | 40 | — | — |

Each of the compositions shown in Table 1 was coated on a well-cleaned soda glass substrate in the dipping method under the conditions shown in Table 2. The coated substrate plate was dried in air at 80° C. for 15 minutes and then baked at 500° C. for 1 hour in air, to thereby obtain a transparent conductive film. The properties of the resulting transparent conductive film are shown in Table 2.

Any of the thus obtained transparent conductive films had a two-layered structure and showed low resistivity and excellent transmittance. The adhesion strength of the film to the substrate plate was sufficient to stand the peeling test with an adhesive tape. Thus it can be understood that properties of the film were improved by addition of the cellulose compound to the composition.

As is apparent from the above-described examples, the composition of the present invention is very useful as a composition for forming a transparent conductive film which shows low sheet resistivity and excellent adhesion strength to a substrate plate.

While the invention has been described in detail and with reference to specific embodiments thereof, it will be apparent to one skilled in the art that various changes and modifications can be made therein without departing from the spirit and scope thereof.

TABLE 2

| Composition No. | Draw Speed in Dipping (cm/min) | Coating Atmosphere Temperature (°C.) | Coating Atmosphere Humidity (%) | Thickness of ITO layer (Å) | Thickness of $SiO_2$ Layer (Å) | Sheet Resistivity ($\Omega/\square$) | Transmittance (% at 550 nm) |
|---|---|---|---|---|---|---|---|
| A | 45 | 15 | 50 | 1200 | 1600 | 400 | 85 |
|   | 50 | 30 | 74 | 1200 | 1600 | 400 | 85 |
| B | 45 | 15 | 50 | 1100 | 1450 | 500 | 86 |
|   | 50 | 30 | 74 | 1100 | 1450 | 500 | 86 |
| C | 25 | 15 | 50 | 1300 | 1700 | 300 | 82 |
|   | 30 | 30 | 74 | 1300 | 1700 | 300 | 82 |
| D | 50 | 15 | 50 | 1100 | 1450 | 600 | 86 |
|   | 60 | 30 | 74 | 1100 | 1450 | 600 | 86 |
| E | 45 | 15 | 50 | 1200 | 1600 | 400 | 85 |
|   | 50 | 30 | 74 | 1200 | 1600 | 600 | 74 |
| F | 50 | 15 | 50 | 1200 | 1600 | 800 | 84 |
|   | 60 | 30 | 74 | 1200 | 1600 | 1500 | 70 |

EXAMPLE 2

Prescribed amounts of indium chloride and stannic chloride were dissolved in ethanol, and the solution was mixed with a non-aqueous silica sol having a concentration of 8% by weight (as $SiO_2$). The non-aqueous silica sol mixed was prepared by neutralizing an aqueous solution containing sodium silicate with sulfuric acid and subjecting the neutralized solution to salting-out with ammonium chloride and extraction with isopropyl alcohol. Then, a prescribed amount of ethyl cellulose was added to the solution and stirred well. There were thus prepared paste-like compositions shown in Table 3.

Each of the resulting compositions was screen printed on a well-cleaned quartz substrate plate at temperature of 15° C. and at a humidity of 50%. The coated substrate plate was dried in air at 100° C. for 15 minutes and then baked at 500° C. for 1 hour in air, to thereby obtain a transparent conductive film. The properties of the resulting transparent conductive film are shown in Table 3.

What is claimed is:

1. A composition for forming a transparent conductive film comprising a mixture of an organic solution of an indium salt of an inorganic acid and a tin salt of an inorganic acid with a non-aqueous silica sol wherein said composition contains about 0.5% to about 30% by weight of said indium salt of inorganic acid calculated as indium oxide, about 0.5% to about 30% by weight of said tin salt of inorganic acid in terms of the proportion of tin to indium, and about 1% to about 200% by weight of said non-aqueous silica sol in terms of the proportion of $SiO_2$ to indium oxide.

2. A composition as claimed in claim 1, wherein said non-aqueous silica sol is one prepared by liquid-phase neutralization of an aqueous solution containing sodium silicate with a mineral acid and subjecting the neutralized solution to salting-out with a salting-out agent and extraction with an organic solvent.

3. A composition as claimed in claim 1, wherein a cellulose compound is added to said composition as an thickener in an amount of about 0.1% to about 50% by weight in said composition.

* * * * *

TABLE 3

| | Composition | | | | | | | | Properties of Baked Film | |
|---|---|---|---|---|---|---|---|---|---|---|
| $InCl_3$ (wt %) | Converted to basis of $In_2O_3$ (wt %) | $SnCl_4$ (wt %) | Converted to basis of Sn/In (wt %) | $SiO_2$ (wt %) | Converted to basis of $SiO_2/In_2O_3$ (wt %) | Ethyl Cellulose (wt %) | Isopropyl Alcohol (wt %) | Ethanol (wt %) | Thickness of ITO Layer (Å) | Sheet Resisitivity ($\Omega/\square$) |
| 8.0 | 5.0 | 0.9 | 9.9 | 2.0 | 40 | 10.0 | 23.0 | 56.1 | 1000 | 800 |
| 8.0 | 5.0 | 0.9 | 9.9 | 2.0 | 40 | 18.0 | 23.0 | 48.1 | 2000 | 400 |